(12) United States Patent
Kim et al.

(10) Patent No.: US 8,633,476 B2
(45) Date of Patent: Jan. 21, 2014

(54) ORGANIC-LIGHT EMITTING DEVICE AND METHOD OF MANUFACTURING THE SAME

(75) Inventors: Mu-Gyeom Kim, Yongin (KR); Chang-Mo Park, Yongin (KR)

(73) Assignee: Samsung Display Co., Ltd. (KR)

( * ) Notice: Subject to any disclaimer, the term of this patent is extended or adjusted under 35 U.S.C. 154(b) by 417 days.

(21) Appl. No.: 12/985,931

(22) Filed: Jan. 6, 2011

(65) Prior Publication Data
US 2011/0248258 A1 Oct. 13, 2011

(30) Foreign Application Priority Data
Apr. 13, 2010 (KR) .................. 10-2010-0033896

(51) Int. Cl.
*H01L 35/24* (2006.01)

(52) U.S. Cl.
USPC ........ 257/40; 257/43; 257/103; 257/E51.018; 438/46; 438/95; 438/99

(58) Field of Classification Search
USPC .......... 257/40, 43, 103, E51.018; 438/46, 95, 438/99, 149
See application file for complete search history.

(56) References Cited

U.S. PATENT DOCUMENTS

| | | | |
|---|---|---|---|
| 8,093,800 B2 * | 1/2012 | Inoue et al. ............ | 313/504 |
| 2002/0187366 A1 | 12/2002 | Hamada et al. | |
| 2003/0008173 A1 | 1/2003 | Hosokawa | |
| 2003/0148871 A1 | 8/2003 | Inoue | |
| 2004/0081836 A1 | 4/2004 | Inoue et al. | |
| 2007/0178331 A1 | 8/2007 | Park et al. | |
| 2007/0241665 A1 | 10/2007 | Sakanoue et al. | |
| 2007/0290604 A1 | 12/2007 | Sakanoue et al. | |
| 2008/0067927 A1 | 3/2008 | Hanawa et al. | |
| 2009/0039775 A1 | 2/2009 | Tomai et al. | |
| 2009/0042326 A1 | 2/2009 | Yamazaki et al. | |
| 2009/0160325 A1 | 6/2009 | Yatsunami et al. | |
| 2009/0309223 A1 | 12/2009 | Luce et al. | |

FOREIGN PATENT DOCUMENTS

| | | |
|---|---|---|
| JP | 2000-223276 A | 8/2000 |
| JP | 2004-139780 | 5/2004 |
| JP | 2006-100857 A | 4/2006 |
| JP | 2006-100857 A | 4/2006 |
| JP | 2006-244850 A | 9/2006 |
| JP | WO2007/043696 A1 | 4/2007 |
| JP | 2007-288074 A | 11/2007 |
| JP | 2007-288074 A | 11/2007 |
| JP | 2008-41692 A | 2/2008 |
| JP | 2008-303365 A | 12/2008 |
| JP | 2011-070987 A | 4/2011 |
| KR | 100797077 B1 | 1/2008 |
| KR | 10-2008-0042887 A | 5/2008 |

OTHER PUBLICATIONS

Official Action issued by the Korean Industrial Property Office dated Aug. 30, 2011 in Korean Patent Application No. 10-2010-0033896, 4 pages.

(Continued)

*Primary Examiner* — Matthew E Warren

(74) *Attorney, Agent, or Firm* — Knobbe Martens Olson & Bear, LLP

(57) ABSTRACT

An organic light-emitting device including: an anode; a hole charging layer (HCL) comprising an oxide semiconductor and formed on the anode; at least one organic layer formed on the HCL; and a cathode formed on the organic layer. The HCL may be an oxide semiconductor including indium (In), gallium (Ga), and zinc (Zn), or an oxide semiconductor including In, Zn, and hafnium (Hf).

18 Claims, 8 Drawing Sheets

(56) References Cited

OTHER PUBLICATIONS

Japanese Official Action issued by the Japanese Patent Office in Japanese Patent Application No. 2011-089163 dated Mar. 21, 2012, 4 pages.

Office Action issued by the Chinese Patent Office on Jun. 7, 2013 in the examination of the Chinese Patent Application No. 201110079108.0, which corresponds to captioned U.S. Appl. No. 12/985,931.

* cited by examiner

ORGANIC-LIGHT EMITTING DEVICE AND METHOD OF MANUFACTURING THE SAME

CROSS-REFERENCE TO RELATED APPLICATIONS

This application claims the benefit of Korean Patent Application No. 10-2010-0033896, filed on Apr. 13, 2010, in the Korean Intellectual Property Office, the disclosure of which is incorporated herein in its entirety by reference.

BACKGROUND

1. Field

The present embodiments relate to an organic light-emitting device, and more particularly, to an organic light-emitting device having a pixel portion that is made in a stacked structure and includes an oxide semiconductor and a method of manufacturing the organic light-emitting device.

2. Description of the Related Technology

Organic light-emitting devices comprise a material that emits light when a voltage is applied thereto. Organic light-emitting devices have advantages such as a high luminance, a wide viewing angle, and a high response speed, compared to a liquid crystal device (LCD). Organic light-emitting devices also do not require a backlight, and thus can be made thin.

A stacked structure of organic layers including an emission layer (EML) of an organic light-emitting device is important for improving a light-emitting efficiency of the organic light-emitting device. In the stacked structure of the organic light-emitting device, p-type and n-type organic semiconductor layers are stacked so as to apply balanced charges including electrons and holes to the EML.

The stacked structure of the organic light-emitting device may include a hole transport layer (HTL) that injects holes from an anode and transports the injected holes to an EML, an electron transport layer (ETL) that injects electrons from a cathode and transports the injected electrons to the EML, and the EML that emits light by recombination of holes and electrons. The organic light-emitting device may further include a hole injection layer (HIL) that injects holes from the anode and an electron injection layer (EIL) that injects electrons from the cathode. Such a stacked structure of the organic layers increases a light-emitting efficiency and reduces a driving voltage.

However, as the needs for a large area and a high luminance of the organic light-emitting device increase, problems such as wasteful power consumption and decrease in lifespan of the organic semiconductor material are caused.

SUMMARY OF CERTAIN INVENTIVE ASPECTS

The present embodiments provide an organic light-emitting device capable of improving lifespan and a light-emitting characteristic because of improved current efficiency and a method of manufacturing the organic light-emitting device.

According to an aspect of the present embodiments, there is provided an organic light-emitting device including: an anode; a hole charging layer (HCL) comprising an oxide semiconductor on the anode; at least one organic layer formed on the HCL; and a cathode formed on the organic layer.

The HCL may be an oxide semiconductor including one material selected from the group consisting of indium (In), gallium (Ga), and zinc (Zn) or an oxide semiconductor including one material selected from the group consisting of In, Zn, and hafnium (Hf).

In the oxide semiconductor including one selected from the group consisting of In, Ga and Zn, In, Ga, and Zn contents may be in the range of about 30 to about 50%, about 30 to about 50%, and about 10 to about 35%, respectively.

In the oxide semiconductor including one selected from the group consisting of In, Zn and Hf, In, Zn, and Hf contents be in the range of about 35 to about 55%, about 35 to about 55%, and about 5 to about 15%, respectively.

The organic layer may include an EML. the oxide semiconductor layer shares a light-emitting region with the EML.

The organic layer may further include at least one layer selected from the group consisting of an HIL and an HTL, between the oxide semiconductor layer and the EML.

The organic light-emitting device may further include at least one layer selected from the group consisting of an ETL and an EIL, between the EML and the cathode.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF CERTAIN INVENTIVE EMBODIMENTS

Hereinafter, embodiments will be described in detail with reference to the accompanying drawings.

Figure 1:
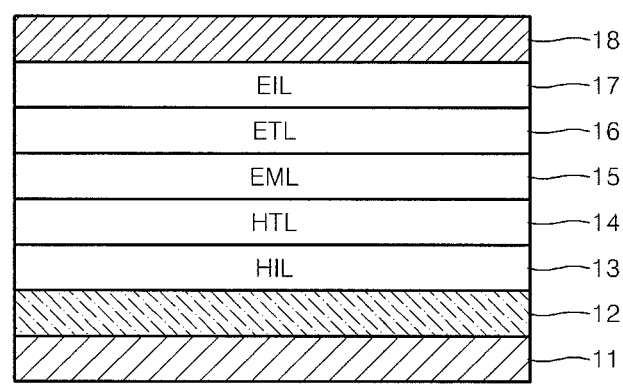
FIG. 1 is a cross-sectional view illustrating a stacked structure of an organic light-emitting device according to an embodiment.

FIG. 1 is a cross-sectional view illustrating a stacked structure of an organic light-emitting device according to an embodiment. Referring to FIG. 1, an oxide semiconductor layer 12 is formed on an anode 11. A hole injection layer (HIL) 13, a hole transfer layer (HTL) 14, an emission layer (EML) 15, an electron transfer layer (ETL) 16, and an electron injection layer (EIL) 17 are sequentially formed on the oxide semiconductor layer 12 in the stated order. A cathode 18 is formed on the EIL 17.

The anode 11 may comprise indium oxide (InO), zinc oxide (ZnO), tin oxide (SnO), indium tin oxide (ITO) or indium zinc oxide (IZO), materials that are composites thereof. The anode 11 may also comprise gold (Au), platinum (Pt), silver (Ag), copper (Cu), or the like.

The oxide semiconductor layer 12 may be an oxide including indium (In), zinc (Zn), and gallium (Ga), or an oxide including indium (In), zinc (Zn), and hafnium (Hf).

An energy level of a valence band of the oxide semiconductor layer 12 may be between an energy level of a work function of the anode 11 and an energy level of a highest occupied molecular orbital (HOMO) of the HIL 13. Meanwhile, the oxide semiconductor layer 12, which is an n-type semiconductor, has many electrons and an amorphous structure, and thus the oxide semiconductor layer 12 has a band tail state or deep state energy level. The band tail state or deep state energy level of the oxide semiconductor layer 12 affect flowing of holes from the anode 11 to the oxide semiconductor layer 12.

In the stacked structure of FIG. 1, the oxide semiconductor layer 12 forms an energy barrier against HIL 13 and traps holes by electrons in it and thus the oxide semiconductor layer 12 may function as a hole charging layer (HCL) for charging the holes in the oxide semiconductor layer 12. The oxide semiconductor layer 12 charges holes and then rapidly supplies the holes to EML, thereby increasing the light-emitting efficiency of the organic light-emitting device.

When the oxide semiconductor layer 12 is an oxide including In, Zn and Ga, In, Ga, and Zn contents may be in the range of about 30 to about 50%, about 30 to about 50%, and about 10 to about 35%, respectively. If In content is lower than about 30%, the oxide semiconductor layer 12 may be a nonconductor. On the other hand, if the In content is higher about 50%, conductivity of the oxide semiconductor layer 12 may be increased, and thus the oxide semiconductor layer 12 may be a conductor. If Ga content is lower than about 30%, the oxide semiconductor layer 12 may be a conductor. On the other hand, if the Ga content is higher than about 50%, the oxide semiconductor layer 12 may be a nonconductor. If Zn content is lower than about 10 the oxide semiconductor layer 12 may be a conductor. On the other hand, if the Zn content is higher than about 35%, the semiconductor layer 12 may be a nonconductor.

When the oxide semiconductor layer 12 is an oxide including In, Zn and Hf, In, Ga, and Hf contents may be in the range of about 35 to about 55%, about 35 to about 55%, and about 5 to about 15%, respectively.

If In content is lower than about 35, the oxide semiconductor layer 12 may be a nonconductor. On the other hand, if the In content is higher about 55%, conductivity of the oxide semiconductor layer 12 may be increased, and thus the oxide semiconductor layer 12 may be a conductor. If Ga content is lower than about 35, the oxide semiconductor layer 12 may be a conductor. On the other hand, if the Ga content is higher than about 55%, the oxide semiconductor layer 12 may be a nonconductor. If Hf content is lower than about 5 the oxide semiconductor layer 12 may be a conductor. On the other hand, if the Hf content is higher than about 15%, the semiconductor layer 12 may be a nonconductor.

The oxide semiconductor layer 12 may have a thickness of from about 10 to about 100 nm.

The HIL 13 withdraws holes from the oxide semiconductor layer 12. Examples of a material for the HIL 13 include, but are not limited to, 4,4',4"-tris 3-methylphenylphenylamino) triphenylamine (m-MTDATA), TDATA, 2T-NATA, polyaniline/dodecylbenzenesulfonic acid (Pani/DBSA), poly 3,4-ethylenedioxythiophene)/poly 4-styrenesulfonate (PEDOT/PSS), polyaniline/camphor sulfonic acid (Pani/CSA), and (polyaniline)/poly 4-styrenesulfonate) (PANI/PSS). The thickness of the HIL 13 may be in the range of about 100 Å to about 1,000 Å.

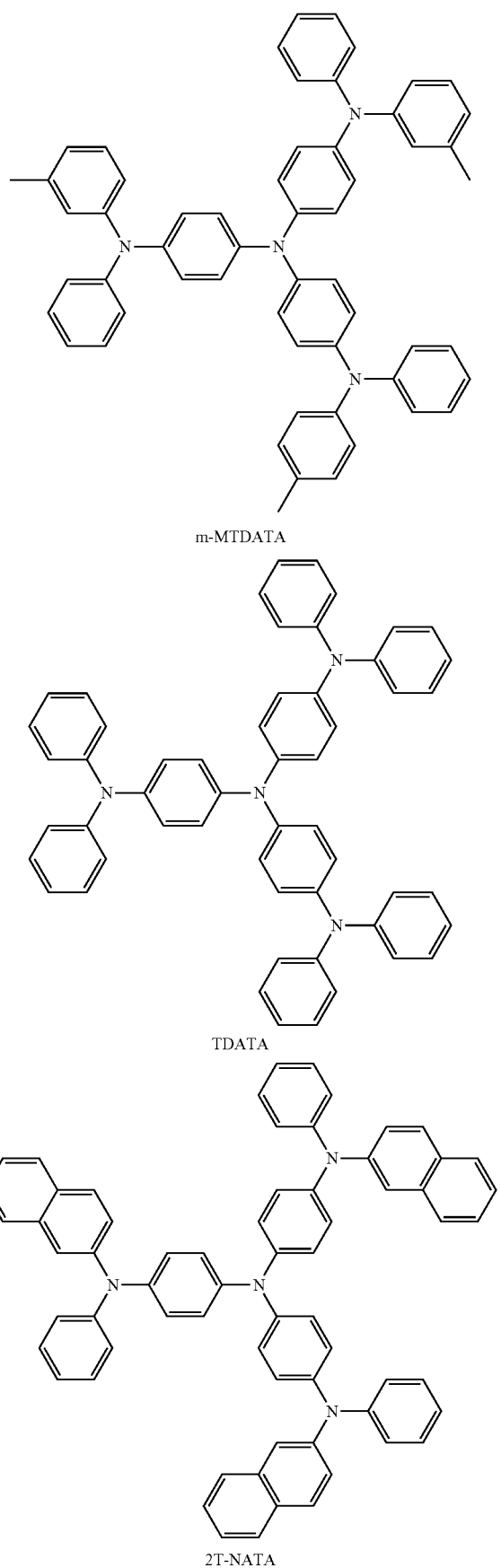

-continued

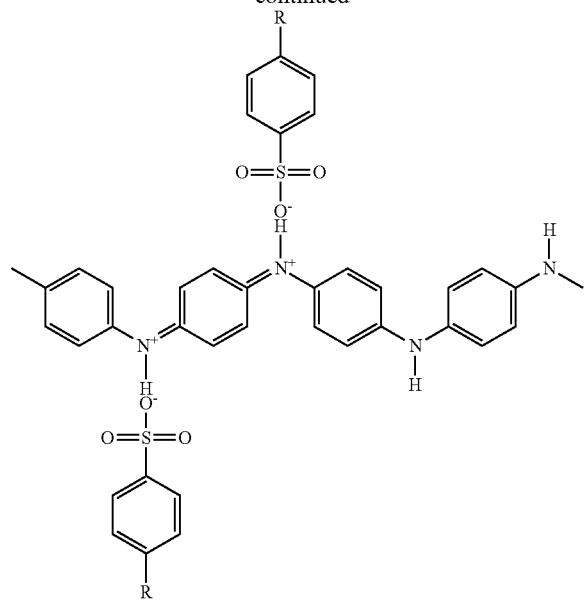

Pani/DBSA

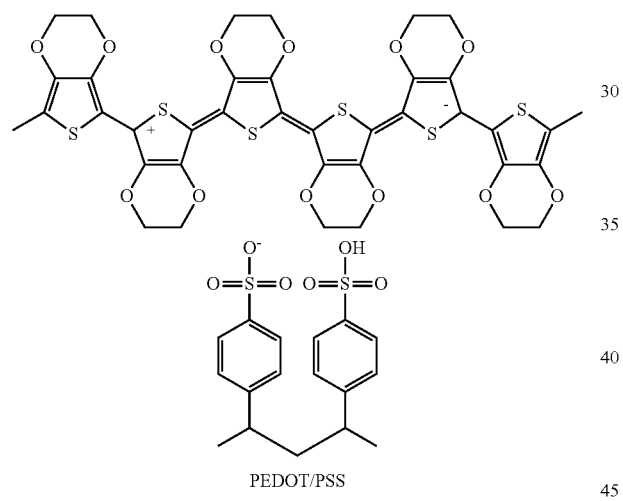

PEDOT/PSS

Examples of a material for the HTL 14 include, but are not limited to, N,N'-bis 3-methylphenyl)-N,N'-diphenyl-[1,1-biphenyl]-4,4'diamine (TPD), N,N'-di(naphthalene-1-il)-N,N'-diphenyl benzidine (α-NPD). The thickness of the HTL 14 may be in the range of about 50 to about 1,000 Å.

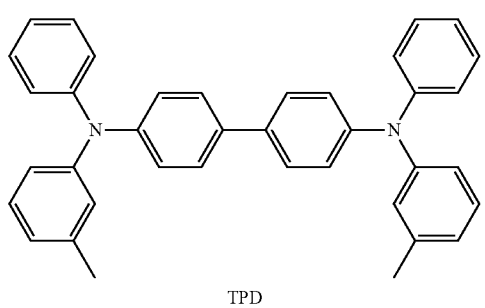

TPD

-continued

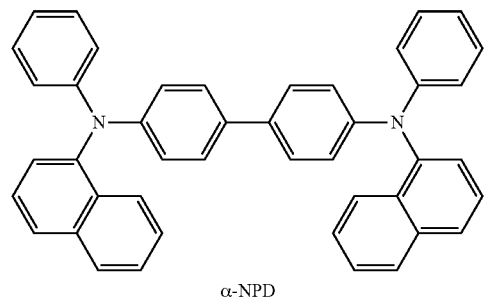

α-NPD

The EML 15 may comprise a light-emitting material, or a combination of a host and a dopant. Examples of the host include, but are not limited to, Alq₃, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, and distyrylarylene (DSA).

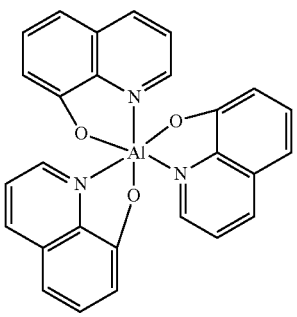

Alq₃

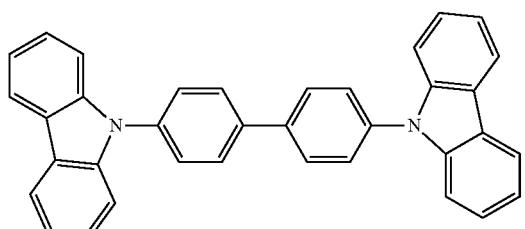

CBP

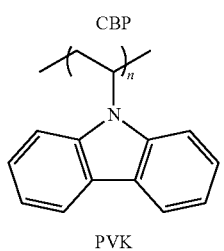

PVK

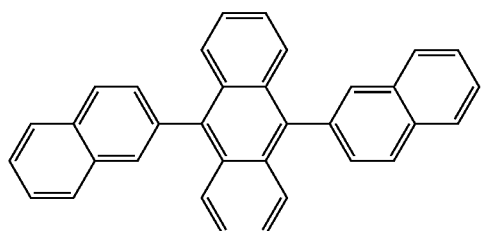

ADN

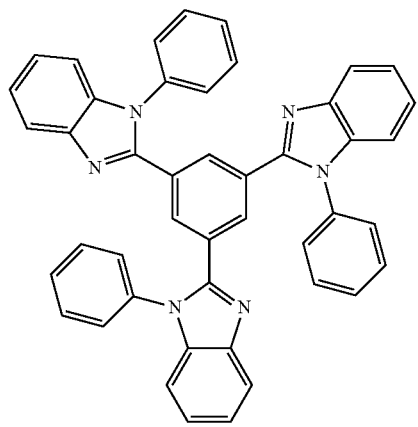

TPBI

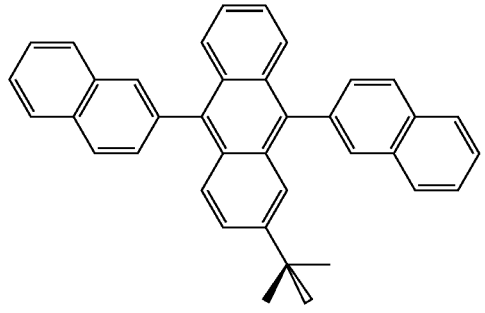

TBADN

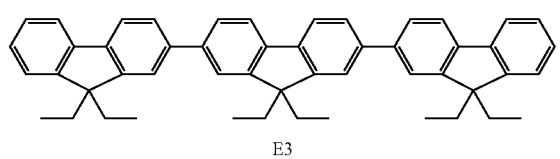

E3

Meanwhile, examples of known red dopants include, but are not limited to, PtOEP, Ir(piq)$_3$, and Btp$_2$Ir(acac).

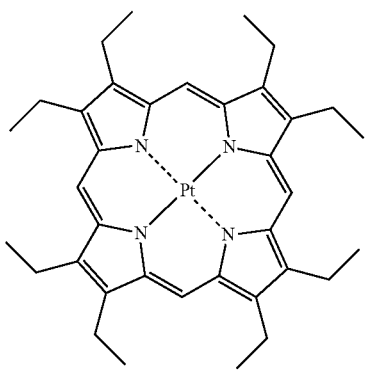

PtOEP

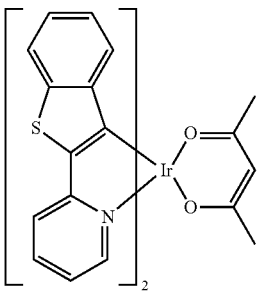

Ir(piq)$_3$   Btp$_2$Ir(acac)

Also, examples of known green dopants include Ir(ppy)$_3$ (ppy=phenylpyridine), Ir(ppy)$_2$(acac), and Ir(mpyp)$_3$, but are not limited thereto.

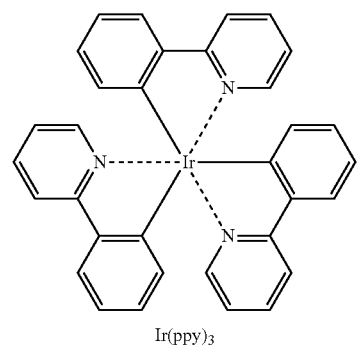

Ir(ppy)$_3$

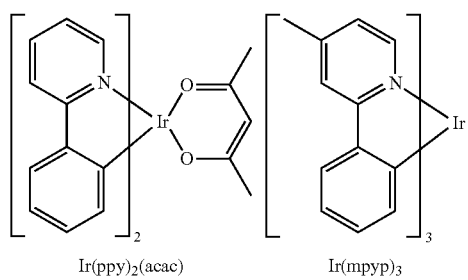

Ir(ppy)$_2$(acac)   Ir(mpyp)$_3$

Examples of known blue dopants include F$_2$Irpic, (F$_2$ppy)$_2$Ir(tmd), Ir(dfppz)$_3$, ter-fluorene, 4,4'-bis 4-diphenylaminostyryl)biphenyl (DPAVBi), and 2,5,8,11-tetra-t-butyl pherylene (TBPe), but are not limited thereto.

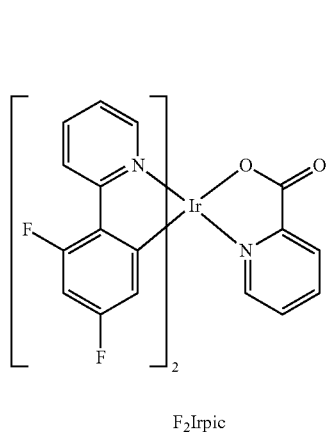
F₂Irpic

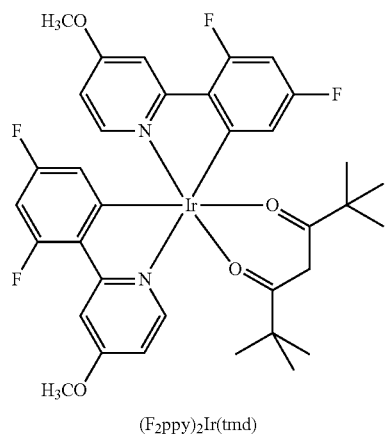
(F₂ppy)₂Ir(tmd)

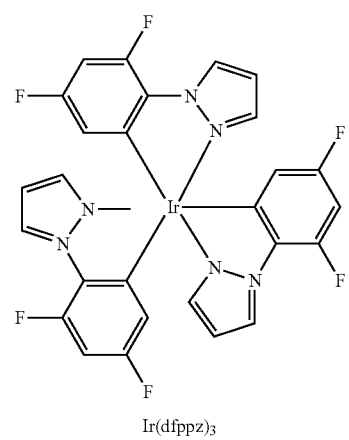
Ir(dfppz)₃

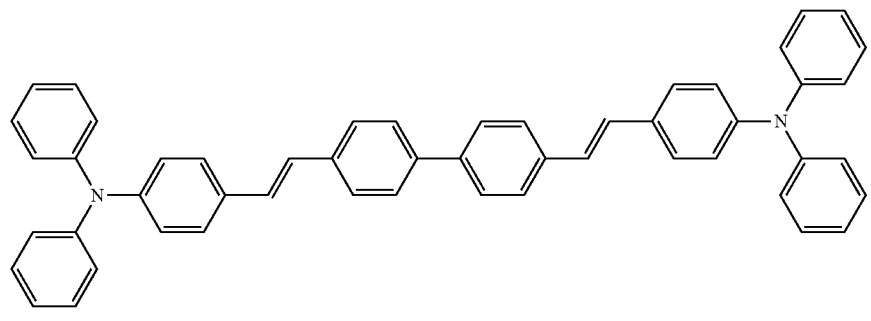
DPAVBi

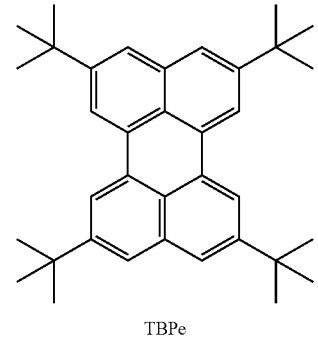
TBPe

When the EML 15 includes a host and a dopant, the dopant content may be in the range of about 0.01 to about 15 parts by weight, generally based on 100 parts by weight of the host, but is not limited thereto. The thickness of the EML 15 may be in the range of about 100 to about 1,000 Å.

Examples of the material that may be used to form the ETL 16 include, but are not limited to, 4,7-diphenyl-1,10-phenanthroline (Bphen), BAlq, tris 8-quinolinorate)aluminum (Alq₃), beryllium bis(benzoquinolin-10-olate (Bebq₂), and TPBi. The thickness of the ETL 16 may be in the range of about 100 to about 1,000 Å.

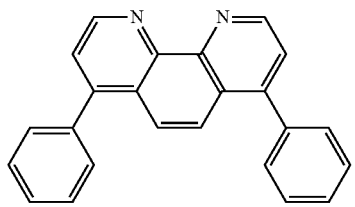
Bphen

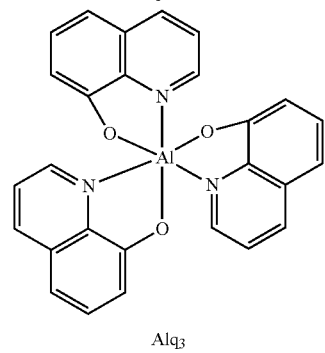
Alq₃

-continued

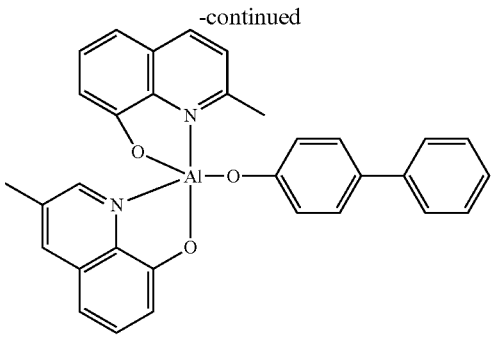
BAlq

The EIL 17 may include any electron injection material. For example, the EIL 17 may include at least one material selected from the group consisting of LiF, NaCl, CsF, Li₂O and BaF₂, but is not limited thereto. The thickness of the EIL 17 may be in the range of about 1 to about 100 Å.

Figure 2:
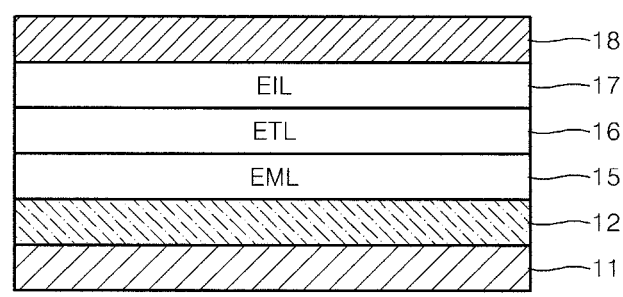
FIG. 2 is a cross-sectional view illustrating a stacked structure of an organic light-emitting device according to another embodiment.

FIG. 2 is a cross-sectional view illustrating a stacked structure of an organic light-emitting device according to another embodiment. The stacked structure of FIG. 2 differs from that of FIG. 1 in that an EML 15 is directly formed on an oxide semiconductor layer 12 in the organic light-emitting device of FIG. 2.

Referring to FIG. 2, the oxide semiconductor layer 12 is formed on an anode 11. The EML 15, an ETL 15, and an EIL 17 are sequentially formed on the oxide semiconductor layer 12 in this order. A cathode 18 is formed on the EIL 17.

In general, a light-emitting region in an EML of an organic light-emitting device is disposed close to an anode. In the current embodiment, the oxide semiconductor layer 12 interposed between the anode 11 and the EML 15 functions as an HCL and also shares a light-emitting region with the EML 15, thereby leading to an emission spectrum different from the emission spectrum led due to the EML 15. Light emission from the light-emitting region of the oxide semiconductor layer 12 and the EML 15 is affected by an energy band structure of the oxide semiconductor layer 12, and light emission may occur in a wide visible wavelength range, indicating that the organic light-emitting device may emit white light.

Materials of the stacked structure of FIG. 2 are the same as those of the stacked structure of FIG. 1.

Characteristics of the oxide semiconductor layer 12 in an energy state, as well as charges of the oxide semiconductor layer 12, may be controlled by changing the oxygen partial pressure and the temperature of thermal treatment when depositing the oxide semiconductor layer 12 by sputtering, or may be controlled through plasma treatment, or ultraviolet (UV)-ozone treatment.

Figure 3:
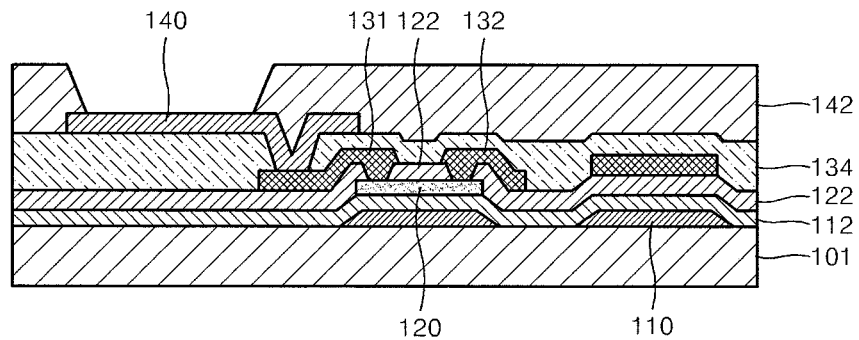
FIG. 3 is a cross-sectional view of an organic light-emitting device according to an embodiment.

FIG. 3 is a cross-sectional view of an organic light-emitting device according to an embodiment.

Referring to FIG. 3, a gate electrode 110 is formed on a substrate 101, and a gate insulating layer 112 is formed on the gate electrode 110. The substrate 101 may comprise glass, quartz, or plastic, or may comprise other materials such as silicon, ceramic, or a metal. A buffer layer (not shown) may be formed in order to improve flatness of the substrate 101 and to prevent impurities from entering the substrate 101 or may be formed for insulation when the substrate 101 includes mobile ions or when a conductive substrate is used, or the buffer layer may be omitted. The buffer layer may comprise silicon oxide, silicon nitride, or silicon oxynitride. The gate electrode 110 may comprise one material selected from the group consisting of gold (Au), silver (Ag), copper (Cu), nickel (Ni), platinum (Pt), palladium (Pd), aluminum (Al), molybdenum (Mo), tungsten (W) and titanium (Ti), or an alloy thereof. The gate insulating layer 112 may comprise an insulating layer such as a silicon oxide layer or a silicon nitride layer.

An active layer 120 is formed on the gate insulating layer 112 so as to face the gate electrode 110. The active layer 120 may comprise polycrystalline silicon, amorphous silicon, an oxide semiconductor, or an organic semiconductor material.

Source/drain electrodes 131 and 132 contact the active layer 120 by passing through a first interlayer insulating layer 122. A stacked structure 140 according to current embodiment contacts a drain electrode 131 by passing through a second interlayer insulating layer 134. The source/drain electrodes 131 and 132 may comprise at least one material selected from the group consisting of Au, Ag, Cu, Ni, Pt, Pd, Al, Mo, W, Ti, and an alloy thereof. The first interlayer insulating layer 122 and the second interlayer insulating layer 134 may comprise an insulating layer such as a silicon oxide or a silicon nitride.

The stacked structure 140 of a pixel portion may include an anode, an oxide semiconductor layer, a HIL, a HTL, an EML, an ETL, an EIL, and a cathode that are sequentially stacked in this order, as described with reference to FIG. 1. Alternatively, the stacked structure 140 of the pixel portion may include the anode, the oxide semiconductor layer, the EML, the ETL, the EIL, and a cathode that are sequentially stacked in this order, as described with reference to FIG. 2.

Reference numeral 142 denotes a pixel-defining layer. The pixel-defining layer 142 may comprise an organic or an inorganic material.

The stacked structure of the pixel portion of each of the organic light-emitting devices according to the above embodiments may be applied to any pixel portion for emitting red, green, and blue light. The organic light-emitting devices according to the above embodiments may also be used as white light-emitting devices.

In the organic light-emitting devices according to the above embodiments, holes charged in a HCL may be rapidly injected into the EML, and thus the organic light-emitting devices may have high light-emitting efficiency. Also, when the HCL contacts the EML, the HCL may share a light-emitting region with the EML, thereby leading to light emission in a wide wavelength range, emitting white light.

Organic light-emitting devices according to embodiments and conventional organic light-emitting device were manufactured in the following examples in order to measure the characteristics of the organic light-emitting devices according to embodiments and compare the same with those of the conventional organic light-emitting devices.

EXAMPLE 1

An organic light-emitting device for emitting blue light was manufactured according to the stacked structure of FIG. 1. An ITO layer was used as an anode, and a GIZO oxide semiconductor layer including In, Ga, Zn in a ratio of 2:2:1 was used as an oxide semiconductor layer.

EXAMPLE 2

An organic light-emitting device for emitting red light was manufactured according to the stacked structure of FIG. 1. An ITO layer was used as an anode, and a GIZO oxide semiconductor layer including In, Ga, Zn in a ratio of 2:2:1 was used as an oxide semiconductor layer.

EXAMPLE 3

An organic light-emitting device for emitting green light was manufactured according to the stacked structure of FIG. 1. An ITO layer was used as an anode, and a GIZO oxide semiconductor layer including In, Ga, Zn in a ratio of 2:2:1 was used as an oxide semiconductor layer.

EXAMPLE 4

An organic light-emitting device for emitting blue light was manufactured according to the stacked structure of FIG. 2. An ITO layer was used as an anode, and a GIZO oxide semiconductor layer including In, Ga, Zn in a ratio of 2:2:1 was used as an oxide semiconductor layer.

COMPARATIVE EXAMPLE 1

An organic light-emitting device for emitting blue light was manufactured according to a stacked structure of ITO anode/HIL/HTL/EML/ETL/EIL/cathode.

COMPARATIVE EXAMPLE 2

An organic light-emitting device for emitting red light was manufactured according to a stacked structure of ITO anode/HIL/HTL/EML/ETL/EIL/cathode.

COMPARATIVE EXAMPLE 3

An organic light-emitting device for emitting green light was manufactured according to a stacked structure of ITO anode/HIL/HTL/EML/ETL/EIL/cathode.

Current Efficiency

Current efficiency, which shows the magnitude of frontal luminance (L[cd/m$^2$]) versus current density (J[A/m$^2$]), is not related to a voltage applied to an organic light-emitting device, and thus is used to evaluate a light-emitting performance of a light-emitting material.

Figure 4:
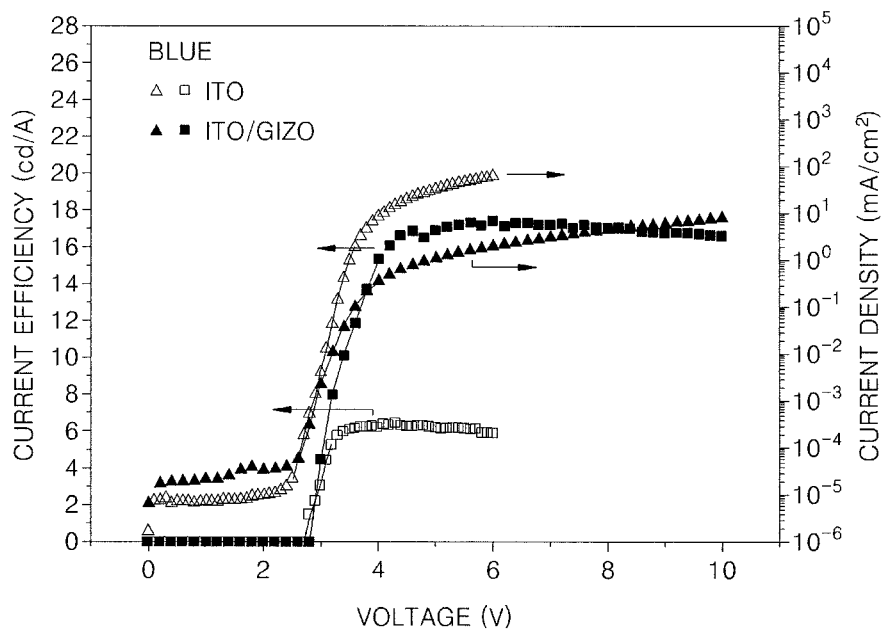
FIG. 4 is a graph illustrating current efficiencies of organic light-emitting devices of Example 1 and Comparative Example 1.

FIG. 4 is a graph illustrating the current efficiencies of organic light-emitting devices of Example 1 and Comparative Example 1. In FIG. 4, plots represented by ▲ and ■ show a current density and a current efficiency of the organic light-emitting device of Example 1, respectively. Meanwhile, in FIG. 4, plots represented by Δ and □ show a current density and a current efficiency of the organic light-emitting device of Comparative Example 1, respectively. The organic light-emitting device of the plot represented by ■ has a stacked structure of ITO anode/GIZO oxide semiconductor layer/HIL/HTL/EML/ETL/EIL/cathode. The organic light-emitting device of the plot represented by □ has a stacked structure of ITO anode/HIL/HTL/EML/ETL/EIL/cathode. The GIZO oxide semiconductor layer used an oxide semiconductor layer including In, Ga, Zn in a ratio of 2:2:1.

In the graph of FIG. 4, the current efficiency of Example 1 using the GIZO oxide semiconductor layer is greater by about three times than that of Comparative Example 1 not using the GIZO oxide semiconductor layer. Consequently, the current efficiency of the organic light-emitting device using the GIZO oxide semiconductor layer was greatly improved. In addition to the increase in current efficiency, the lifespan of the organic light-emitting device may be extended.

Figure 5:
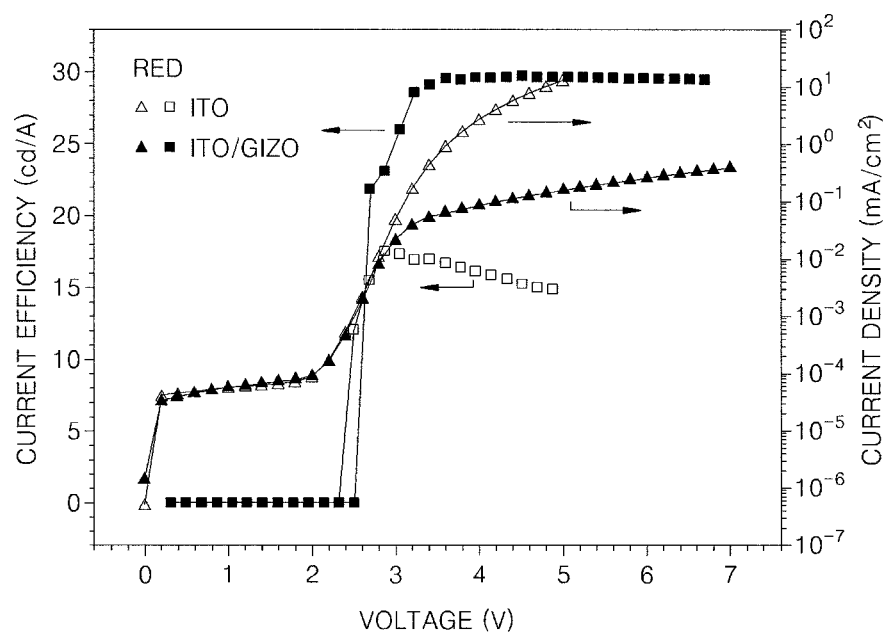
FIG. 5 is a graph illustrating current efficiencies of organic light-emitting devices of Example 2 and Comparative Example 2.

FIG. 5 is a graph illustrating the current efficiencies of organic light-emitting devices of Example 2 and Comparative Example 2. In FIG. 5, plots represented by ▲ and ■ show a current density and a current efficiency of the organic light-emitting device of Example 2, respectively. Meanwhile, in FIG. 5, plots represented by Δ and □ show a current density and a current efficiency of the organic light-emitting device of Comparative Example 1, respectively. Similarly to the organic light-emitting device emitting blue light, the current efficiency of the organic light-emitting device emitting red light using the GIZO oxide semiconductor layer was greatly improved.

Figure 6:
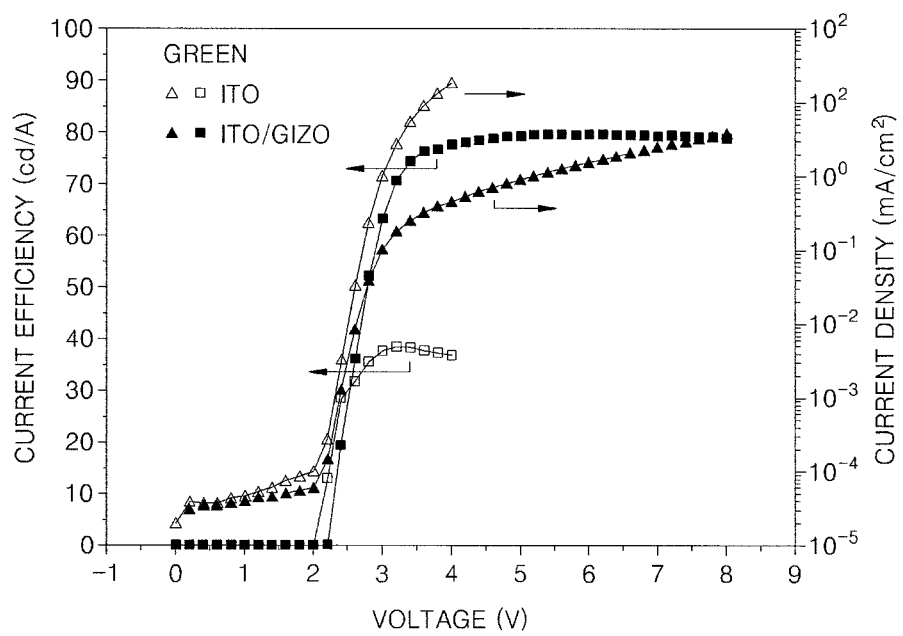
FIG. 6 is a graph illustrating current efficiencies of organic light-emitting devices of Example 3 and Comparative Example 3.

FIG. 6 is a graph illustrating the current efficiencies of organic light-emitting devices of Example 3 and Comparative Example 3. In FIG. 6, plots represented by ▲ and ■ show a current density and a current efficiency of the organic light-emitting device of Example 3, respectively. Meanwhile, in FIG. 6, plots represented by Δ and □ show a current density and a current efficiency of the organic light-emitting device of Example 3, respectively. Similarly to the organic light-emitting device emitting blue light, the current efficiency of the organic light-emitting device emitting green light using the GIZO oxide semiconductor layer was greatly improved.

Lifespan

Figure 7:
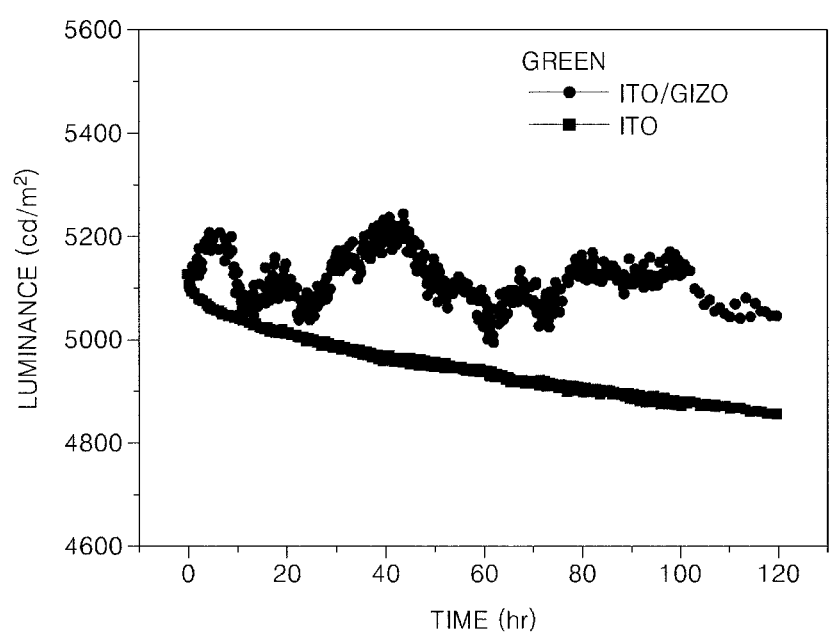
FIG. 7 is a graph illustrating luminance with respect to time of the organic light-emitting devices of Example 3 and Comparative Example 3.

FIG. 7 is a graph of luminance with respect to time of the organic light-emitting devices of Example 3 and Comparative Example 3. In FIG. 7, a plot represented by ● shows luminance of the organic light-emitting device of Example 3, and a plot represented by ○ shows luminance of the organic light-emitting device of Comparative Example 3. In the graph of FIG. 7, when only the ITO anode of Comparative Example 3 was used, the luminance of the organic light-emitting device decreased. However, when the GIZO oxide semiconductor layer was formed on the ITO anode of Example 3, there was a variation of the luminance of the organic light-emitting device, but the degree of decrease in the luminance of the organic light-emitting device was indistinct. Also, even as time went by, the luminance of Example 3 using the GIZO oxide semiconductor layer on the ITO anode was higher than the luminance of Comparative Example 3 using only ITO anode, and thus the lifespan of the organic light-emitting device using the GIZO oxide semiconductor layer was extended.

Measurement of Transient Electroluminescence (TEL)

In general, when a pulse voltage is applied, light-emitting starts after about 1 μs, because it takes time for holes and electrons to enter the EML due to a high resistance of the organic semiconductor layer. The time when light-emitting starts is influenced by the mobilities of charges in the organic semiconductor layers and energy level differences with adjacent organic semiconductor layer. In general, since charges that entered the EML lead to a space-charge-limited-current (SCLC) due to a low mobility, the charges are forced to enter the EML, and thus a light-emitting curve with respect to time may have an "S" shape. While the pulse voltage is maintained, the EML is saturated with the injected charges as time goes by, maintaining the intensity of light emission constant. The intensity of the saturated light emission is the same as the intensity of light emission when a voltage is applied in a direct current (DC) mode.

Figure 8:
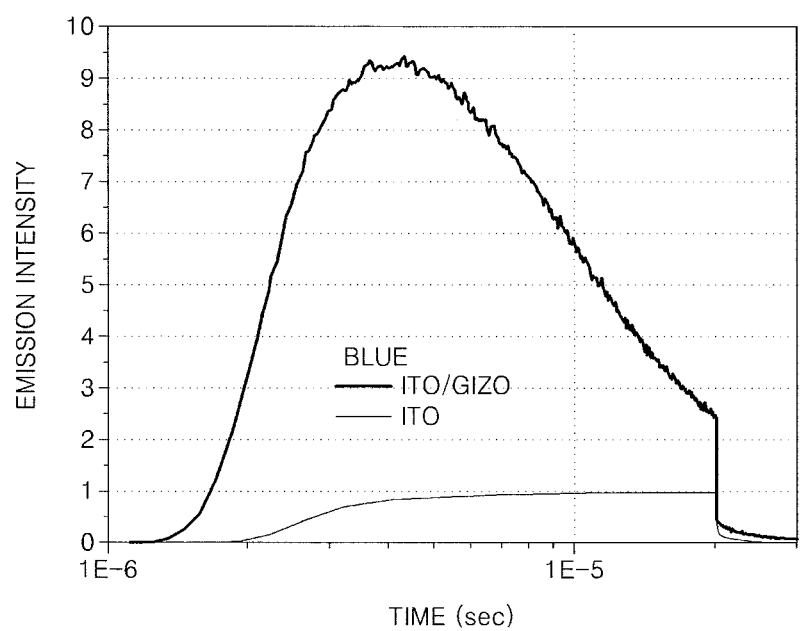
FIG. 8 is a graph illustrating emission intensities with respect to time after applying a pulse voltage to the organic light-emitting devices of Example 1 and Comparative Example 1.

FIG. 8 is a graph illustrating emission intensities with respect to time after applying a pulse voltage to the organic light-emitting devices of Example 1 and Comparative Example 1. In FIG. 8, a bold line shows an emission intensity of Example 1, and a fine line shows an emission intensity of Comparative Example 1.

In the graph of FIG. 8, the intensities of light emission in the organic light-emitting devices for emitting blue light of Example 1 and Comparative Example 1 were repetitively measured by using an oscilloscope while applying a positive pulse voltage to opposite ends of each of the organic light-emitting devices at a constant frequency of 10 Hz. Although not shown in FIG. 8, the width of the applied pulse voltage was 20 μs.

In FIG. 8, the TEL of Comparative Example 1 shows a general S-shaped pattern. However, an emission start time of Example 1 is earlier than that of Comparative Example 1, and the intensity of light emission of Example 1 is increased by nine times compared to Comparative Example 1. Such an emission pattern may be generated when a large amount of charges enter the EML rapidly. However, since the GIZO oxide semiconductor layer forms an n-type semiconductor including a large amount of electrons, injection of holes from the anode is slowed due to an electrical interaction, which is opposite from what is expected from the early emission start time of graph of FIG. 8.

The earlier emission start time is attributed to the fact that holes trapped in the GIZO oxide semiconductor layer, for example, holes charged in the GIZO oxide semiconductor layer, are rapidly injected into the EML when a voltage is applied to the organic light-emitting device. Also, it is believed that the holes injected from the GIZO oxide semiconductor layer into the EML combine with electrons that entered to the EML earlier than the holes, thereby leading to a great initial emission intensity. Thus, the GIZO oxide semiconductor layer may function as a HCL.

Figure 9:
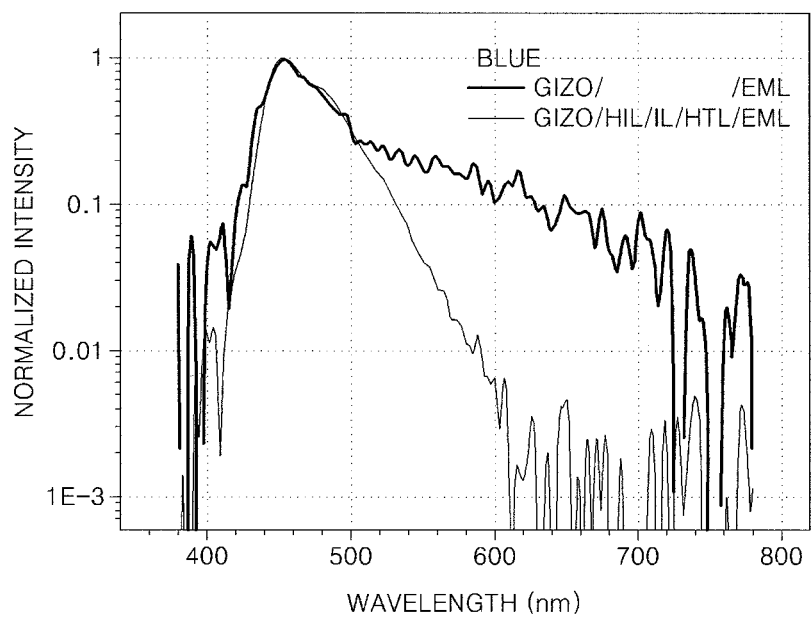
FIG. 9 is a graph illustrating wavelength spectrums of the organic light-emitting device of Example 1 and an organic light-emitting devices of Example 4.

FIG. 9 is a graph illustrating wavelength spectrums of the organic light-emitting devices of Example 1 and Example 4. In FIG. 9, a bold line shows an emission spectrum of the organic light-emitting device of Example 1, and a fine line shows an emission spectrum of the organic light-emitting device of Comparative Example 1. In the graph of FIG. 9, an emission intensity of Example 4, in which the EML is directly formed on the GIZO oxide semiconductor layer, is maintained high in a wide wavelength range from a blue wavelength to a wavelength of 700 nm, compared to that of Example 1 in which the HIL and the HTL are formed on the GIZO oxide semiconductor layer. Thus, the organic light-emitting device of Example 4 may be used to generate white light.

The organic light-emitting device of Example 4 shows the emission spectrum over a long wavelength band, due to the fact that the GIZO oxide semiconductor layer functions as a HCL and shares a light-emitting region with the EML, and also that the emission of the light-emitting region is influenced by an energy band structure of the GIZO oxide semiconductor layer.

Figure 10:
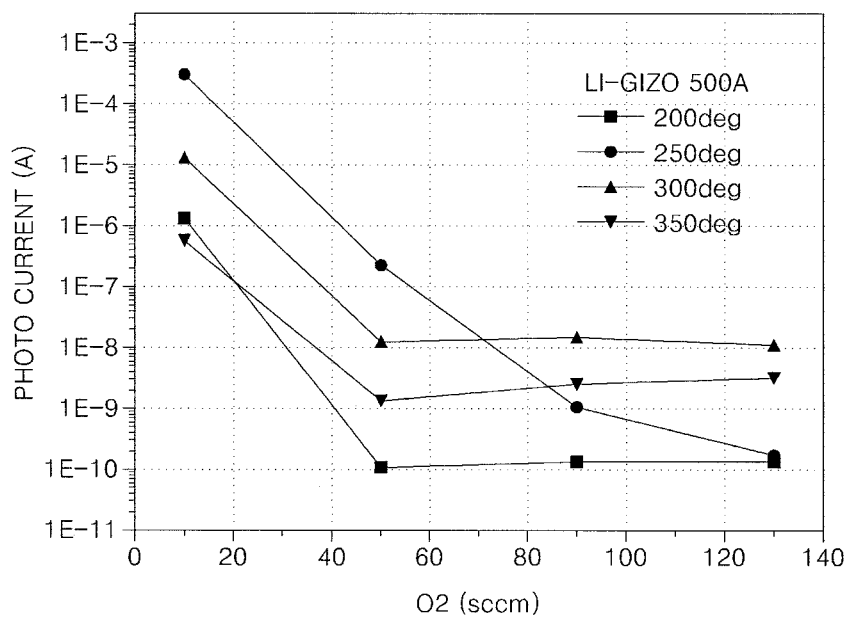
FIG. 10 is a graph illustrating variations of photocurrent with respect to temperature of thermal treatment and oxygen partial pressure when forming an oxide semiconductor layer.

FIG. 10 is a graph illustrating variations of photocurrent with respect to temperature of thermal treatment and oxygen partial pressure when forming an oxide semiconductor layer. UV rays of 365 nm and 4 mW are radiated onto the oxide semiconductor layer, and then a photocurrent applied to two different spots was measured. In the graph of FIG. 10, the photocurrent is greatest when the flow rate of oxygen is lowest, for example, 10 sccm. Afterwards, even if the flow rate of oxygen is increased, the photocurrent does not change much. However, when the temperature of thermal treatment is 250° C., the photocurrent is increased as the flow rate of oxygen is decreased. Also, the graph of FIG. 10 shows that the photocurrent varies according to the thermal treatment temperature.

The photocurrent is related to conductivity. As the conductivity of a material increases, the photocurrent value also increases. Referring to the graph of FIG. 10, when forming the oxide semiconductor layer, the conductivity of the oxide semiconductor layer may be controlled by controlling the temperature of thermal treatment and the flow rate of oxygen. Meanwhile, the conductivity of the oxide semiconductor layer may also be controlled through plasma treatment and UV-ozone treatment.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting device comprising:
   an anode;
   a hole charging layer (HCL) comprising an oxide semiconductor on the anode;
   at least one organic layer formed on the HCL;
   a cathode formed on the organic layer; and
   wherein the HCL is an oxide semiconductor comprising indium (In), gallium (Ga), and zinc (Zn) or an oxide semiconductor comprising In, Zn, and hafnium (Hf).

2. The organic light-emitting device of claim 1, wherein in the oxide semiconductor comprising In, Ga and Zn, the In, Ga, and Zn are from about 30 to about 50%, from about 30 to about 50%, and from about 10 to about 35%, respectively.

3. The organic light-emitting device of claim 1, wherein in the oxide semiconductor comprising In, Zn and Hf, the In, Zn, and Hf are from about 35 to about 55%, from about 35 to about 55%, and from about 5 to about 15%, respectively.

4. The organic light-emitting device of claim 1, wherein the band gap energy of the oxide semiconductor is from about 3 to about 3.5 eV, and the valence band energy of the oxide semiconductor is between a work function of the anode and an HOMO energy of the organic layer contacting the oxide semiconductor layer.

5. The organic light-emitting device of claim 4, wherein the energy state of the oxide semiconductor comprises a band tail state energy level and a deep state energy level.

6. The organic light-emitting device of claim 1, wherein the organic layer comprises an emission layer.

7. The organic light-emitting device of claim 6, wherein the oxide semiconductor layer and the emission layer share a light-emitting region.

8. The organic light-emitting device of claim 7, wherein the organic light-emitting device emits light from about 400 nm to about 700 nm.

9. The organic light-emitting device of claim 6, wherein the organic layer further comprises at least one layer selected from the group consisting of an HIL and an HTL, between the oxide semiconductor layer and the EML.

10. The organic light-emitting device of claim 6 or 7, further comprising at least one selected from the group consisting of an ETL and an EIL, between the EML and the cathode.

11. The organic light-emitting device of claim 1, wherein the anode comprises indium tin oxide (ITO) or indium zinc oxide (IZO).

12. The organic light-emitting device of claim 1, wherein the organic light-emitting device emits blue, red, or green light.

13. The organic light-emitting device of claim 1, further comprising:
   a substrate;
   a thin film transistor comprising a gate electrode formed on the substrate, a gate insulating layer formed on the gate electrode and the substrate, an active layer facing the gate electrode and formed on the gate insulating layer, and source and drain electrodes that are electrically connected to the active layer; and
   an insulating layer,
   wherein the anode contacts the source and drain electrodes by passing through the insulating layer.

14. A method of manufacturing an organic light-emitting device, the method comprising:
   forming an anode;
   forming a hole charging layer (HCL) comprising an oxide semiconductor on the anode;
   forming at least one organic layer on the HCL; and
   forming a cathode on the organic layer;
   wherein the HCL is an oxide semiconductor comprising indium (In), gallium (Ga), and zinc (Zn) or an oxide semiconductor comprising In, Zn, and hafnium (Hf).

15. The method of claim 14, wherein in the oxide semiconductor comprising In, Ga and Zn, the In, Ga, and Zn contents are from about 30 to about 50%, from about 30 to about 50%, and from about 10 to about 35%, respectively.

16. The method of claim 14, wherein in the oxide semiconductor comprising In, Ga and Zn, the In, Ga and Zn contents are from about 20 to about 40%, from about 20 to about 40%, and from about 20 to about 40%, respectively.

17. The method of claim 14, wherein in the oxide semiconductor comprising In, Zn and Hf, the In, Zn, and Hf contents are from about 35 to about 55%, from about 35 to about 55%, and from about 5 to about 15%.

18. The method of claim 14, wherein the band gap energy of the oxide semiconductor is from about 3 to about 3.5 eV, and the valence band energy of the oxide semiconductor is between a work function of the anode and a highest occupied molecular orbital (HOMO) energy of the organic layer contacting the oxide semiconductor layer.

* * * * *